United States Patent
El-Chammas

(10) Patent No.: US 9,136,856 B1
(45) Date of Patent: Sep. 15, 2015

(54) BACKGROUND DAC CALIBRATION FOR PIPELINE ADC

(71) Applicant: TEXAS INSTRUMENTS INCORPORATED, Dallas, TX (US)

(72) Inventor: Manar Ibrahim El-Chammas, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 22 days.

(21) Appl. No.: 14/191,012

(22) Filed: Feb. 26, 2014

(51) Int. Cl.
*H03M 1/10* (2006.01)
*H03M 1/66* (2006.01)
*H03M 1/12* (2006.01)

(52) U.S. Cl.
CPC ............ *H03M 1/1023* (2013.01); *H03M 1/124* (2013.01); *H03M 1/664* (2013.01)

(58) Field of Classification Search
CPC ... H03M 1/1061; H03M 1/167; H03M 1/164; H03M 1/1038; H03M 1/12; H03M 1/468; H03M 1/44; H03M 1/1009; H03M 1/1023; H03M 1/1057; H03M 1/0607; H03M 1/66; H03M 3/38; H03M 3/458; H03M 1/46
USPC .................. 341/118–121, 144, 155, 161, 162
See application file for complete search history.

(56) References Cited

U.S. PATENT DOCUMENTS

| | | | | |
|---|---|---|---|---|
| 4,908,621 A * | 3/1990 | Polonio et al. | ................ | 341/120 |
| 6,489,904 B1 * | 12/2002 | Hisano | ........................ | 341/120 |
| 6,686,864 B1 * | 2/2004 | Moreland | .................... | 341/161 |
| 7,283,083 B1 * | 10/2007 | Kamal et al. | ................. | 341/161 |
| 8,723,706 B1 * | 5/2014 | Shin et al. | ..................... | 341/118 |
| 8,791,844 B2 * | 7/2014 | Meacham et al. | ............ | 341/118 |
| 2006/0208933 A1 * | 9/2006 | Chen et al. | .................... | 341/120 |
| 2008/0074301 A1 * | 3/2008 | Ueno | ............................. | 341/132 |
| 2009/0243907 A1 * | 10/2009 | Nazemi et al. | ................ | 341/161 |
| 2012/0112939 A1 * | 5/2012 | Miki et al. | ..................... | 341/118 |
| 2014/0132438 A1 * | 5/2014 | Shen et al. | .................... | 341/172 |

* cited by examiner

*Primary Examiner* — Linh Nguyen
(74) *Attorney, Agent, or Firm* — Alan A. R. Cooper; Frank D. Cimino

(57) ABSTRACT

A circuit includes a track and hold (T/H) block to track an analog input signal during a track phase and to hold the analog input signal during a hold phase. A pipelined converter stage includes an analog to digital converter (ADC) receives the analog input signal from the T/H block and generates a digital output signal corresponding to the analog input signal. A digital to analog converter (DAC) element in the pipelined converter stage receives the digital output signal from the ADC and generates a current output signal representing an analog value for a portion of the analog input signal. A detector monitors the current output signal of the DAC element with respect to a predetermined reference current during the track phase and generates a trim signal if the current output signal is different from the predetermined reference current.

20 Claims, 3 Drawing Sheets

BACKGROUND DAC CALIBRATION FOR PIPELINE ADC

TECHNICAL FIELD

This disclosure relates to analog to digital converter (ADC) circuits, and more particularly to a pipelined ADC that employs background calibration of digital to analog converters (DAC) that are utilized in the analog conversion process of the ADC.

BACKGROUND

Pipelined analog-to-digital converters (ADC's) have become the most popular ADC architecture for sampling rates from a few mega-samples per second (Msps) to over one hundred Msps. Resolutions typically range from eight bits at the faster sample rates up to 16 bits at the lower rates. These resolutions and sampling rates cover a wide range of applications, including CCD imaging, ultrasonic medical imaging, digital receivers, base stations, digital video, cable modems, and fast Ethernet, for example.

With respect to the pipelined ADC architecture, an analog input, VIN, is first sampled and held steady by a sample-and-hold (S&H) (also referred to as track and hold), while an ADC in a first stage coarsely quantizes it to three bits, in some examples. Two and four-bit ADC's are also typical. In the 3-bit example, the 3-bit output of the ADC is then fed to a 3-bit DAC (accurate to the accuracy of the overall converter), and the analog output of the DAC is subtracted from the input and the difference is referred to as "residue." The subtracted residue is gained up via a residue amplifier (RA) and fed to the next stage (Stage 2) of the pipelined ADC. This gained-up residue continues through the pipeline, providing N bits per stage until it reaches a backend ADC, which resolves the last least significant bits (LSB) bits. Since the bits from each stage are determined at different points in time, all the bits corresponding to the same sample are time-aligned with shift registers before being fed to digital-error-correction logic. When a given stage finishes processing a sample, determining the bits, and passing the residue to the next stage, it can then start processing the next sample received from the sample-and-hold embedded within each stage. This pipelining action is one reason for the high throughput of the ADC.

Most modern pipelined ADCs employ a technique called "digital error correction" to greatly reduce the accuracy requirement of the ADCs (and thus the individual comparators). The DAC's in the pipeline can also affect the overall accuracy of the pipelined ADC. For example, non-linearity in a given DAC can cause inaccuracy in the overall ADC output. The DAC's in the ADC pipeline are often trimmed during manufacturing to account for measured inaccuracies. Unfortunately, as the pipelined ADC is exposed to environmental issues such as temperature, the factory trim parameters may no longer apply.

SUMMARY

This disclosure relates to a pipelined analog to digital converter (ADC) that employs background calibration of digital to analog converters (DAC) that are utilized in the analog conversion process of the ADC. In one aspect, a circuit includes a track and hold (T/H) block to track an analog input signal during a track phase and to hold the analog input signal during a hold phase. A pipelined converter stage includes an analog to digital converter (ADC) that receives the analog input signal from the T/H block and generates a digital output signal corresponding to the analog input signal. A digital to analog converter (DAC) element in the pipelined converter stage receives the digital output signal from the ADC and generates a current output signal representing an analog value for a portion of the analog input signal. A detector monitors the current output signal of the DAC element with respect to a predetermined reference current during the track phase and generates a trim signal if the current output signal is different from the predetermined reference current. A calibration block adjusts the current output signal of the DAC element based on the trim signal from the detector.

In another aspect, a circuit includes a track and hold (T/H) block to track an analog input signal during a track phase and to hold the analog input signal during a hold phase. A pipelined converter stage includes an analog to digital converter (ADC) that receives the analog input signal from the T/H block and generates a digital output signal corresponding to the analog input signal. A digital to analog converter (DAC) block in the pipelined converter stage receives the digital output signal from the ADC. The DAC block includes a plurality of DAC elements to receive the digital output signal from the ADC and to generate a current output signal for each DAC element representing an analog value for a portion of the analog input signal. A residue amplifier, associated with each respective pipelined converter stage except for a last stage, sums the current output signal from each element of the DAC block and the analog input signal sampled from the T/H block during the hold phase to generate a residue output that is fed to a next pipelined converter stage to perform analog conversion of the analog input signal. A detector monitors each current output signal of each DAC element with respect to a predetermined reference current during the track phase and generates a trim signal for a respective DAC element if the current output signal is different from the predetermined reference current of the respective DAC element. A calibration block associated with each DAC element adjusts the current output signal of each DAC element based on the trim signal for the respective DAC element from the detector.

In yet another aspect, an integrated circuit includes a pipelined converter that includes a plurality of conversion stages to perform analog to digital conversion. Each conversion stage of the pipelined converter includes a track and hold (T/H) block to track an analog input signal during a track phase and to hold the analog input signal during a hold phase. Each stage includes an analog to digital converter (ADC) to receive the analog input signal from the T/H block and to generate a digital output signal corresponding to the analog input signal. A digital to analog converter (DAC) block n each stage receives the digital output signal from the ADC. The DAC block includes a plurality of DAC elements to receive the digital output signal from the ADC and to generate a current output signal for each DAC element representing an analog value for a portion of the analog input signal. A detector monitors each current output signal of each DAC element with respect to a predetermined reference current during the track phase and generates a trim signal for a respective DAC element if the current output signal is different from the predetermined reference current of the respective DAC element. A calibration block associated with each DAC element adjusts the current output signal of each DAC element based on the trim signal for the respective DAC element from the detector.

DETAILED DESCRIPTION

This disclosure relates to a pipelined analog to digital converter (ADC) that employs background calibration of digital to analog converters (DAC) that are utilized in the analog conversion process of the ADC. In a pipelined ADC, an analog input signal is captured via a track and hold (T/H) block during a hold phase, digitized by an ADC, and re-converted back to an analog value via the DAC. Output from the DAC is then subtracted from the analog input sampled during the hold phase to generate a residue value that is further processed in proceeding stages of the ADC pipeline for overall analog conversion of the analog input signal. Final output from the pipeline is the digital representation of the analog input signal that is received from each ADC at each respective stage. During the track-and-hold track phase however, background DAC calibration can be performed. Since the track phase represents a dormant phase for the ADC and DAC, the time duration of the track phase can be employed to calibrate DAC elements within the DAC and thus dynamically improve DAC accuracy over various environmental conditions of the ADC pipeline.

To enable background calibration, a detector monitors the current output signal of the DAC element with respect to a predetermined reference current during the track phase and generates a trim signal if the current output signal is different from the predetermined reference current. A calibration block can be associated with each DAC element to adjust the current output signal of the DAC element based on the trim signal from the detector. A single detector and reference can be employed to calibrate a plurality of DAC elements with each DAC element being associated with its own calibration block. A control circuit can be provided to enable sequential monitoring and calibration of each DAC element via the detector and calibration blocks. The control circuit can synchronize background calibration of each DAC element with the respective track phase and sequentially calibrate all DAC elements in a given ADC over a number of track and hold phase cycles.

Figure 1:
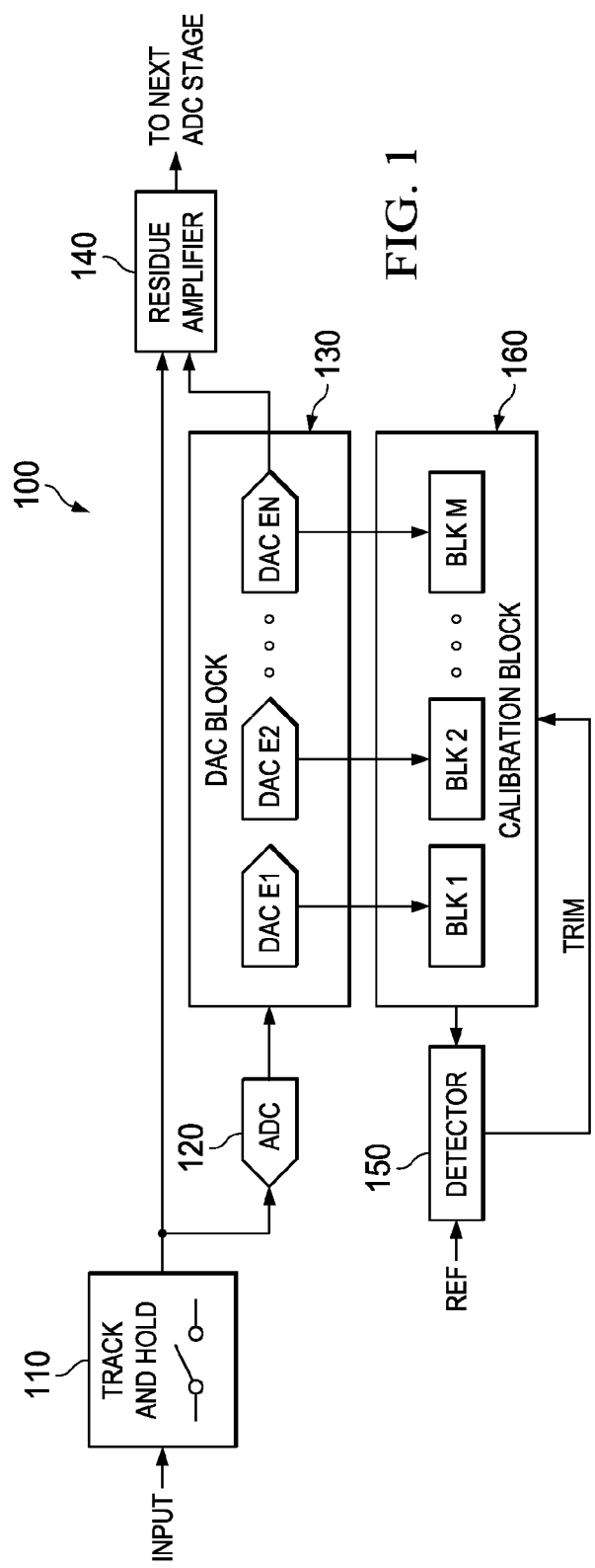
FIG. 1 illustrates an example of schematic block diagram of a single stage of a pipelined analog to digital converter (ADC) that employs background calibration of a digital to analog converter (DAC) that is utilized in the analog conversion process of the ADC.

FIG. 1 illustrates an example of schematic block diagram of a single circuit stage 100 of a pipelined analog to digital converter (ADC) that employs background calibration of a digital to analog converter (DAC) that is utilized in the analog conversion process of the ADC. As used herein, the term circuit can include a collection of active and/or passive elements that perform a circuit function such as an analog or digital converter. The term circuit can also include an integrated circuit where all the circuit elements are fabricated on a common substrate, for example. The circuit stage 100 includes a track and hold (T/H) block 110 to track an analog input signal (INPUT) during a track phase and to hold the analog input signal during a hold phase. Such phases can be initiated via a clock signal (not shown) that has the effect of closing a switch in the T/H block 110 during the track phase and opening the switch during the hold phase. The T/H block 110 can also be referred to as a sample and hold (S/H) block.

An analog to digital converter (ADC) 120 to receives the analog input signal from the T/H block and generates a digital output signal. A digital to analog converter (DAC) block 130 receives the digital output signal from the ADC 120. The DAC block 130 includes a plurality of DAC elements, shown as DAC E1 through DAC EN, with N being a positive integer, to receive the digital output signal from the ADC 120 and to generate a current output signal for each DAC element. Each DAC element can include a pair of transistors that switch a current source and receive positive and negative drive signals from the ADC 120 as will be shown and described below with respect to FIG. 2. As shown, output of the DAC block 130 is summed with the analog input signal held by the T/H block 120 via a residue amplifier 140. Output of the residue amplifier 140 is passed to the next stage of the ADC pipeline where a plurality of such stages can form an integrated circuit ADC.

A detector 150 (e.g., comparator) monitors each current output signal of each DAC element with respect to a predetermined reference current (REF) during the track phase of the T/H block 110. The detector 150 generates a trim signal (TRIM) for a respective DAC element in the DAC block 130 if the current output signal is different from the predetermined reference current of the respective DAC element. A calibration block 160 includes calibration blocks BLK 1 though BLK M, with M being a positive integer. Each calibration block BLK 1 through BLK M can be associated with each DAC element in the DAC block 130 to adjust the current output signal of each DAC element based on the trim signal for the respective DAC element from the detector. As will be shown below with respect to FIGS. 4 and 5, clock timing can be generated to cycle though all the DAC elements in the DAC block and generate background calibration of each DAC element during successive track and hold clock cycles.

To enable background calibration, the detector 150 monitors the current output signal of a selected DAC element in the DAC block 130 with respect to the predetermined reference current REF during the track phase and generates the trim signal TRIM if the current output signal exceeds the predetermined reference current. A calibration block BLK 1 though BLK M can be associated with each DAC element DAC E1 though DAC EN to adjust the current output signal of the DAC element based on the trim signal from the detector. A single detector 160 and reference REF can be employed to calibrate a plurality of DAC elements with each DAC element being associated with its own calibration block. A control circuit (not shown) can be provided to enable sequential monitoring and calibration of each DAC element in the DAC block 130 via the detector 150 and calibration blocks 160. The control circuit can synchronize background calibration of each DAC element with the respective track phase and sequentially calibrate all DAC elements in a given ADC over a number of track and hold phase cycles.

Figure 2:
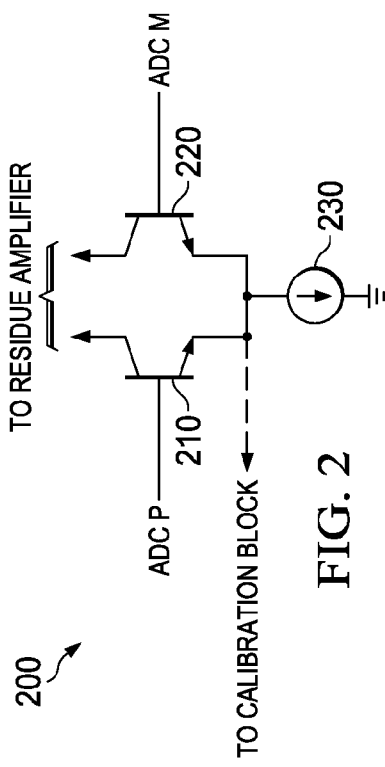
FIG. 2 illustrates an example of a single digital to analog converter (DAC) element depicted in FIG. 1.

FIG. 2 illustrates an example of a single digital to analog converter (DAC) element 200 depicted in FIG. 1. The DAC element 200 includes a pair of transistors 210 and 220 that drive a current source 230. Although the transistors 210 and 220 are shown as NMOS, PMOS implementations are also possible. The respective transistors 210 and 220 are driven via complimentary ADC inputs shown as ADC P and ADC M, where P and M represent positive and minus. As shown, current output from the common connection of transistors 210 and 220 that drives the current source 230 is what is fed to the calibration block during background calibration. As used herein, background calibration refers to calibration of a given DAC element 200 during the track phase of the pipelined ADC. Complimentary output from the DAC element 220 via collectors of transistors 210 and 220 is fed to a residue amplifier (not shown).

Figure 3:
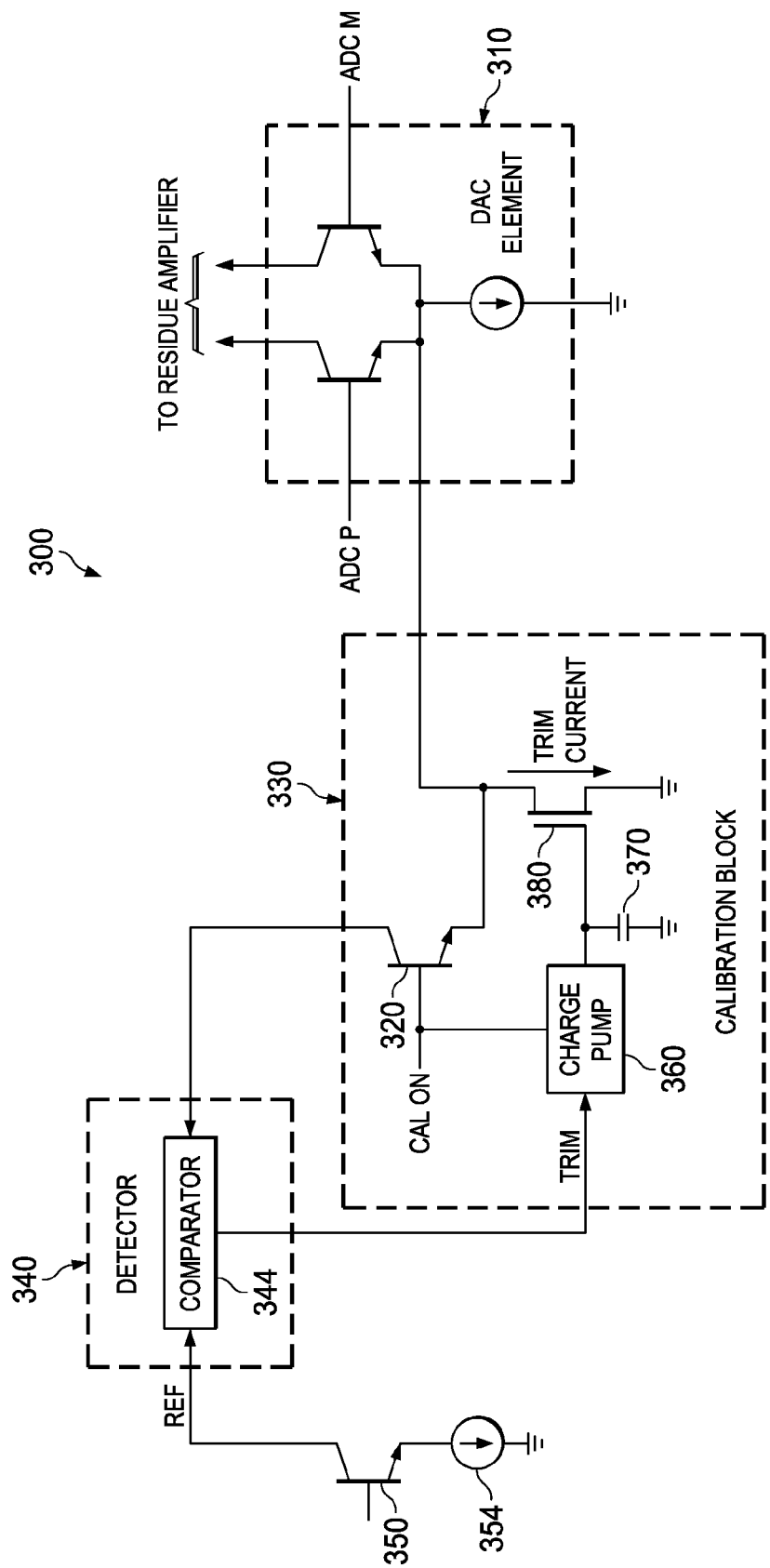
FIG. 3 illustrates an example circuit to perform background calibration of a digital to analog converter (DAC) element that is utilized in the analog conversion process of an analog to digital converter (ADC).

FIG. 3 illustrates an example circuit 300 to perform background calibration of a digital to analog converter (DAC) element that is utilized in the analog conversion process of a pipelined analog to digital converter (ADC). During a background calibration phase, a CAL ON signal is generated (e.g., via circuit controller or analog sequencer) that cause current from a DAC element 310 to be sampled by transistor 320 in a calibration block 330. Sampled current from transistor 320 is sent to a detector 340 which includes comparator 344. The comparator 344 compares the sampled current from the DAC element 310 with a reference current REF that is generated via transistor 350 and current source 354. The reference current REF is utilized to calibrate all DAC elements for a given DAC block. Thus, if temperature causes an offset drift in the REF, for example, all DAC elements will be calibrated with the same offset which effectively nullifies any error across the DAC block.

If the comparator 344 senses that the sampled current from the DAC element 310 is different from the REF, a trim signal (TRIM) is generated to the calibration block 330. As shown, the trim signal drives a charge pump 360 which in turn drives a capacitor 370 and transistor 380 to adjust the trim current from the DAC element 310. When the CAL ON signal is high, background calibration of the DAC element 310 can occur. When the CAL ON signal is low, the DAC element 310 is in normal operation providing its output to the residue amplifier. It is noted that the analog logic depicted in the circuit 300 can be reversed where P type elements replaces N type elements and so forth.

Figure 4:
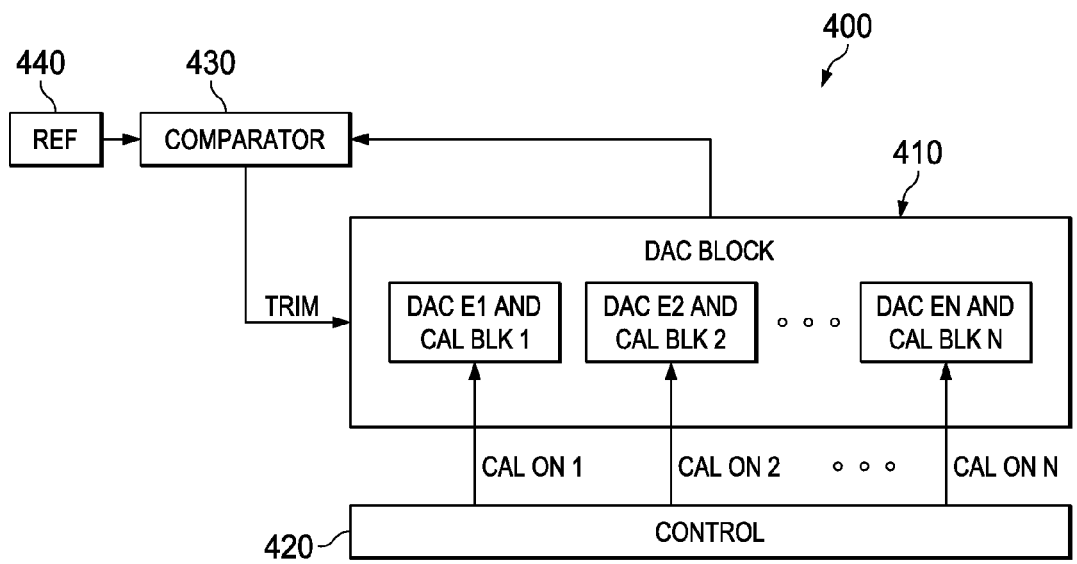
FIG. 4 illustrates an example circuit to perform background calibration of a plurality of digital to analog converter (DAC) elements that are utilized in the analog conversion process of an analog to digital converter (ADC).
Figure 5:
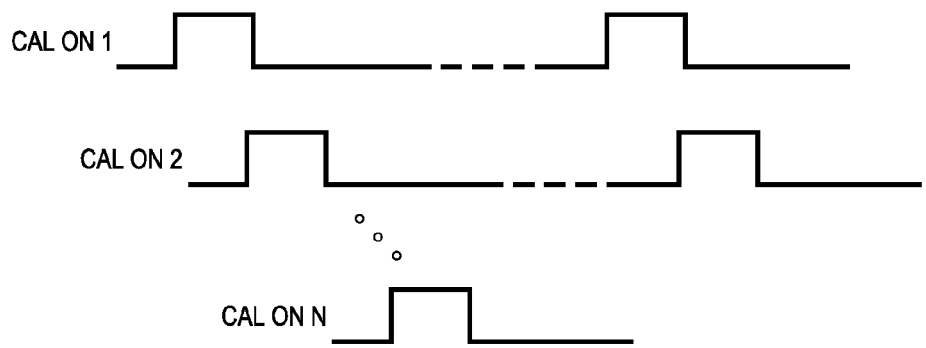
FIG. 5 illustrates an example timing diagram for the example circuit depicted in FIG. 4.

FIG. 4 illustrates an example circuit 400 to perform background calibration of a plurality of digital to analog converter (DAC) elements that are utilized in the analog conversion process of an analog to digital converter (ADC). The circuit 400 includes a DAC block 410. The DAC block 410 includes a plurality of DAC elements 1 though N, with each DAC element in the DAC block having an associated calibration block. A control circuit 420 generates a cycle of pulses representing CAL ON signals from each calibration block of each DAC element in the DAC block 410. An example timing diagram generating the respective CAL ON signals for the control circuit 420 is shown in FIG. 5. The control circuit 420 can be a controller or a discrete timing circuit that generates the timing signals to calibrate each DAC element in the DAC block 410. As shown, output from a respective DAC element in the DAC block is monitored via a comparator 430 with respect to a reference 440. If the output from the respective DAC element of the DAC block 410 exceeds the threshold set by the reference 440, the comparator 430 issues a trim signal TRIM to sink trim current from the respective DAC element.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    a track and hold (T/H) block to track an analog input signal during a track phase and to hold the analog input signal during a hold phase;
    a pipelined converter stage that includes an analog to digital converter (ADC) to receive the analog input signal from the T/H block and to generate a digital output signal corresponding to the analog input signal;
    a digital to analog converter (DAC) element in the pipelined converter stage to receive the digital output signal from the ADC and to generate a current output signal representing an analog value for a portion of the analog input signal;
    a detector to monitor the current output signal of the DAC element with respect to a predetermined reference current during the track phase and to generate a trim signal if the current output signal is different from the predetermined reference current; and
    a calibration block that adjusts the current output signal of the DAC element based on the trim signal from the detector.

2. The circuit of claim 1, further comprising a residue amplifier, associated with each respective pipelined converter stage except for a last stage, that sums the current output signal from the DAC element and the analog input signal sampled from the T/H block during the hold phase to generate a residue output that is fed to a next pipelined converter stage of the pipelined converter stage to perform analog conversion of the analog input signal.

3. The circuit of claim 2, wherein the DAC element includes a pair of transistors coupled to the residue amplifier, the pair of transistors drive a current source and receive complimentary inputs from the ADC.

4. The circuit of claim 1, wherein the detector further comprises a comparator to monitor the current output signal of the DAC element with respect to a predetermined reference current during the track phase and to generate the trim signal if the current output signal exceeds the predetermined reference current.

5. The circuit of claim 4, wherein the predetermined reference current for the comparator is generated via a transistor that drives a current source.

6. The circuit of claim 1, wherein the calibration block samples current from the DAC element during the track phase via a transistor that is enabled via a calibrate signal.

7. The circuit of claim 1, wherein the calibration block includes a charge pump that generates a charge output based on the trim signal generated by the detector.

8. The circuit of claim 7, wherein the charge output of the charge pump drives a capacitor and transistor to sink current from the DAC element during calibration.

9. A circuit comprising:
    a track and hold (T/H) block to track an analog input signal during a track phase and to hold the analog input signal during a hold phase;
    a pipelined converter stage that includes an analog to digital converter (ADC) to receive the analog input signal from the T/H block and to generate a digital output signal corresponding to the analog input signal;
    a digital to analog converter (DAC) block in the pipelined converter stage to receive the digital output signal from the ADC, wherein the DAC block includes a plurality of DAC elements to receive the digital output signal from the ADC and to generate a current output signal for each DAC element representing an analog value for a portion of the analog input signal;

a residue amplifier, associated with each respective pipelined converter stage except for a last stage, that sums the current output signal from each element of the DAC block and the analog input signal sampled from the T/H block during the hold phase to generate a residue output that is fed to a next pipelined converter stage to perform analog conversion of the analog input signal;

a detector to monitor each current output signal of each DAC element with respect to a predetermined reference current during the track phase and to generate a trim signal for a respective DAC element if the current output signal is different from the predetermined reference current of the respective DAC element; and a calibration block associated with each DAC element that adjusts the current output signal of each DAC element based on the trim signal for the respective DAC element from the detector.

10. The circuit of claim 9, wherein each DAC element includes a pair of transistors coupled to the residue amplifier, the pair of transistors drive a current source and receive complimentary inputs from the ADC.

11. The circuit of claim 9, wherein the detector further comprises a comparator to monitor the current output signal of each DAC element with respect to a predetermined reference current during the track phase and to generate the trim signal if the current output signal exceeds the predetermined reference current.

12. The circuit of claim 11, wherein the predetermined reference current for the comparator is generated via a transistor that drives a current source.

13. The circuit of claim 9, wherein the calibration block samples current from the associated DAC element during the track phase via a transistor that is enabled via a calibrate signal.

14. The circuit of claim 9, wherein the calibration block includes a charge pump that generates a charge output based on the trim signal generated by the detector.

15. The circuit of claim 14, wherein the charge output of the charge pump drives a capacitor and transistor to sink current from the DAC element during calibration.

16. The circuit of claim 9, further comprising a control circuit to generate a plurality of calibrate signals to successively enable calibration of the DAC elements in the DAC block over successive clock cycles.

17. An integrated circuit comprising:

a pipelined converter that includes a plurality of conversion stages to perform analog to digital conversion, each conversion stage of the pipelined converter comprises:

a track and hold (T/H) block to track an analog input signal during a track phase and to hold the analog input signal during a hold phase;

an analog to digital converter (ADC) to receive the analog input signal from the T/H block and to generate a digital output signal corresponding to the analog input signal;

a digital to analog converter (DAC) block to receive the digital output signal from the ADC, wherein the DAC block includes a plurality of DAC elements to receive the digital output signal from the ADC and to generate a current output signal for each DAC element representing an analog value for a portion of the analog input signal;

a detector to monitor each current output signal of each DAC element with respect to a predetermined reference current during the track phase and to generate a trim signal for a respective DAC element if the current output signal is different from the predetermined reference current of the respective DAC element; and a calibration block associated with each DAC element that adjusts the current output signal of each DAC element based on the trim signal for the respective DAC element from the detector.

18. The circuit of claim 17, further comprising a residue amplifier a residue amplifier, associated with each respective pipelined converter stage except for a last stage, that sums the current output signal from each element of the DAC block and the analog input signal sampled from the T/H block during the hold phase to generate a residue output that is fed to a next pipelined converter stage to perform analog conversion of the analog input signal.

19. The circuit of claim 17, further comprising a control circuit to generate a plurality of calibrate signals to successively enable calibration of the DAC elements in the DAC block over successive clock cycles.

20. The circuit of claim 17, wherein the detector further comprises a comparator to monitor the current output signal of each DAC element with respect to a predetermined reference current during the track phase and to generate the trim signal if the current output signal exceeds the predetermined reference current.

* * * * *